United States Patent
Yang et al.

[11] Patent Number: 6,147,007
[45] Date of Patent: Nov. 14, 2000

[54] METHOD FOR FORMING A CONTACT HOLE ON A SEMICONDUCTOR WAFER

[75] Inventors: Chan-Lon Yang; Wei-Che Huang, both of Taipei; Tong-Yu Chen, Hsin-Chu, all of Taiwan

[73] Assignee: United Microelectronics Corp., Hsin-Chu, Taiwan

[21] Appl. No.: 09/330,597

[22] Filed: Jun. 11, 1999

[51] Int. Cl.$^7$ ................................................. H01L 21/00
[52] U.S. Cl. ........................ 438/723; 438/724; 438/738; 438/740
[58] Field of Search ................................. 438/723, 724, 438/738, 740, 743, 744, 745; 216/67, 79

[56] References Cited

U.S. PATENT DOCUMENTS

| | | | |
|---|---|---|---|
| 5,883,006 | 3/1999 | Iba | 438/738 X |
| 6,008,121 | 12/1999 | Yang et al. | 438/744 |
| 6,043,164 | 3/2000 | Ngugen et al. | 438/738 X |
| 6,063,711 | 5/2000 | Chao et al. | 438/740 X |

*Primary Examiner*—William Powell
*Attorney, Agent, or Firm*—Winston Hsu

[57] ABSTRACT

The present invention relates to a method of forming a contact hole on the semiconductor wafer. The semiconductor wafer comprises, in ascending order, a substrate, a silicon nitride layer, a silicon oxide layer, and a photo-resist layer. There is a hole in the photo-resist layer. The method comprises: (1) performing a first anisotropic etching process in a downward direction to remove the silicon oxide layer under the hole down to the surface of the silicon nitride layer to form a recess; (2) performing an in-situ plasma cleaning process to entirely remove the polymer material remaining at the bottom of the recess; (3) performing an in-situ second anisotropic etching process in a downward direction to remove the silicon nitride layer from the bottom of the recess down to the surface of the substrate to form the contact hole; (4) performing another in-situ cleaning process to entirely remove the polymer material remaining at the bottom of the contact hole.

8 Claims, 2 Drawing Sheets

METHOD FOR FORMING A CONTACT HOLE ON A SEMICONDUCTOR WAFER

BACKGROUND OF THE INVENTION

1. Field of the Invention

The present invention relates to a semiconductor process, and more particularly, to a method of forming a contact hole on a semiconductor wafer.

2. Description of the Prior Art

In a multilevel metallization process, metallic conductive layers are used to connect each metal oxide semiconductor (MOS) transistor on the semiconductor wafer to form a stacked circuit structure. The multilevel metallization process improves the integration of the semiconductor wafer so it is widely applied in very large scale integration (VLSI) and Ultralarge-scale integration (ULSI) processing. The inter-layer dielectric (ILD) layer between the MOS transistor and the metallic conductive layer protects and insulates the electric units on the semiconductor wafer. The contact plug in the ILD layer functions as an electric conductive wire for the MOS transistor and the metallic conductive layer. In the formation of the contact plug, etching is performed to form the contact hole. Then the contact hole is filled with metal material to form the contact plug.

In semiconductor processing beyond 0.25 µm, a borderless contact hole is used to increase the available surface area on the semiconductor wafer. The prior art contact etch process has a silicon nitride layer positioned between the ILD layer and the MOS transistor. The ILD layer is made of silicon oxide. The silicon nitride layer functions to prevent further etching. When producing the borderless contact hole on the ILD layer, the etching process stops at the silicon nitride layer. In this way, further etching of silicon oxide portions of the MOS transistor is prevented.

Please refer to FIG. 1. FIG. 1 is a schematic drawing of the structure of the prior art borderless contact holes 24, 26 on the semiconductor wafer 10. The semiconductor wafer 10 comprises a substrate 12, a MOS transistor 14, a Ti-silicide layer 19, a shallow trench 16 positioned on the substrate 12, a silicon nitride layer 18 positioned on the MOS transistor 14, a silicon oxide layer 20 deposited on the silicon nitride layer 18, and a photo-resist layer 22 deposited on the silicon oxide layer 20 to define the position and pattern of the borderless contact holes 24, 26.

In the formation of the borderless contact holes 24,26, the silicon nitride layer 18 and the silicon oxide layer 20 are first deposited onto the semiconductor wafer 10. The photo-resist layer 22 is then formed in the predetermined region of the silicon oxide layer 20. This is accomplished by using the mask for pattern transfer thereby defining the position of the borderless contact holes 24,26. Next, the contact holes 24, 26 are grossly formed by performing an anisotropic dry etching on those portions of the silicon oxide layer 20 which are not covered by the photo-resist layer 22. The reactive gases used in dry etching are formed from a mixture of fluorocarbon, such as $C_4F_8$ and Carbon monoxide (CO) with argon (Ar). CO is introduced to balance the ratio of the carbon atoms to fluorine atoms.

Then, the silicon oxide layer 20 is removed down to the silicon nitride layer 18. The etching process of the silicon nitride layer 18 and the photo-resist strip process are performed to complete the formation of the contact holes 24,26. In the dry etching process of the silicon oxide layer 20, polymers may form on the side walls of the contact holes 24,26 and the surface of silicon nitride layer 18. These polymers interfere with etching of the silicon nitride layer 18 and may also adversely affect the after etching inspection critical dimension (AEICD) of the borderless contact hole 24,26. Also, during the dry etching process of the silicon oxide layer 18, polymers remaining on the surface of the silicon nitride layer 18 may cause defects on the gate or the drain of the MOS transistor 14 under the contact hole 26 to occur.

In the dry etching process of the silicon nitride layer 18, some polymers form on the side walls and the base of the contact holes 24,26. Therefore, the contact area of the gate and drain of the MOS transistor 14 at the base of the contact holes 24,26 is reduced. When the contact hole is filled with metal material to form a contact plug, the reduced contact area increases the resistance (over 5 Ω) of the contact plug.

SUMMARY OF THE INVENTION

It is therefore a primary objective of the present invention to provide a method of forming a borderless contact hole on a semiconductor wafer to solve the above mentioned problem.

In preferred embodiment, the present invention relates to a method for forming a contact hole on a semiconductor wafer, the semiconductor wafer comprising a substrate, a silicon nitride (SiN) layer positioned on the substrate, a silicon oxide layer positioned on the silicon nitride layer, and a photo-resist layer positioned on the silicon oxide layer, the photo-resist layer comprising a hole, the method comprising:

performing a first anisotropic etching process in a downward direction to remove the silicon oxide layer under the hole down to the surface of the silicon nitride layer to form a recess, wherein polymer material remains at the bottom of the recess following this first anisotropic etching process;

performing an in-situ plasma cleaning process to entirely remove the polymer material remaining at the bottom of the recess; and performing an in-situ second anisotropic etching process in a downward direction to remove the silicon nitride layer from the bottom of the recess down to the surface of the substrate to form the contact hole.

It is a advantage of the present invention that the profile of the borderless contact hole is more vertical and there is no remaining polymer in the contact hole, so the borderless contact plug has lower contact resistance.

These and other objective of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 2:
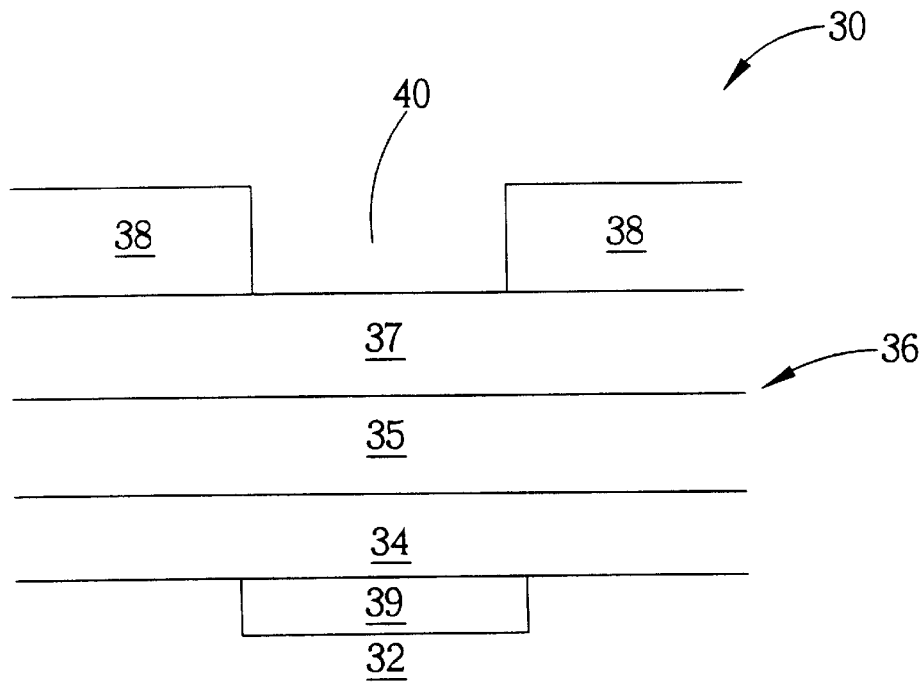
FIG. 2 to FIG. 4 are the schematic drawings of forming a contact hole according to the present invention.
Figure 3:
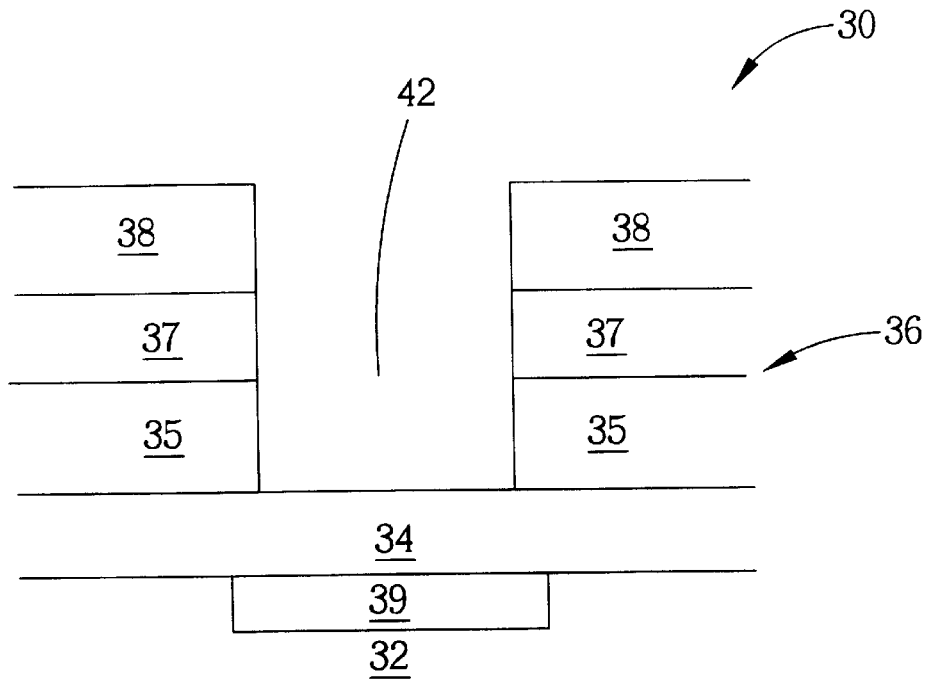
Figure 4:
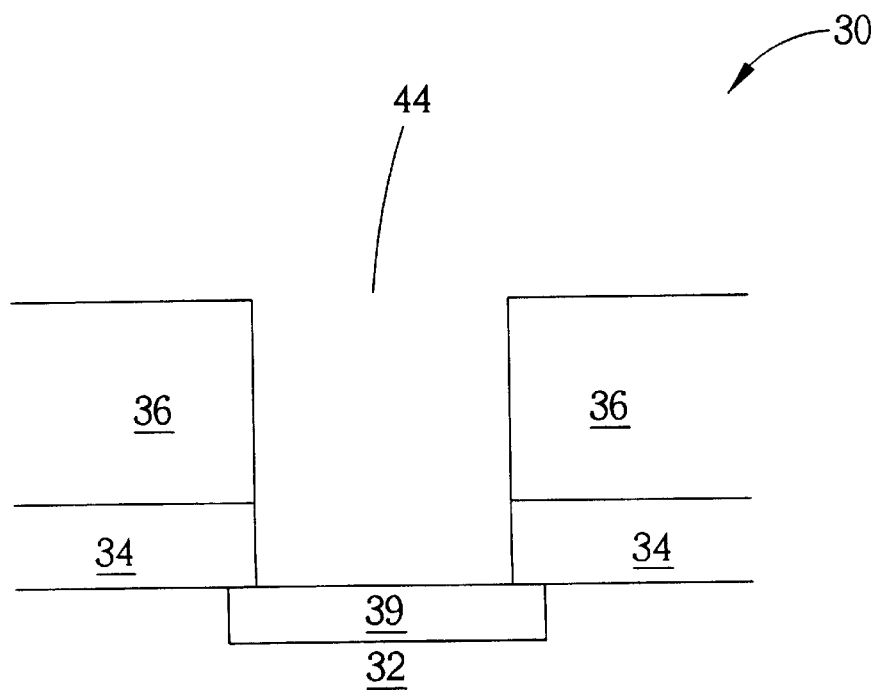

Please refer to FIG. 2 to FIG. 4. FIG. 2 to FIG. 4 are the schematic drawings of forming a contact hole according to the present invention. The present invention is a method of etching a contact hole 44 on a semiconductor wafer 30 with the contact hole 44 being a borderless contact hole to form a borderless contact plug having low contact resistance. As shown in FIG. 2, the semiconductor wafer 30 comprises a substrate 32, a Ti-silicide layer 39, a silicon nitride (SiN) layer 34 positioned on the substrate 32, a silicon oxide layer 36 positioned on the silicon nitride layer 34, and a photo-resist layer 38 positioned on the silicon oxide layer 36.

Figure 1:
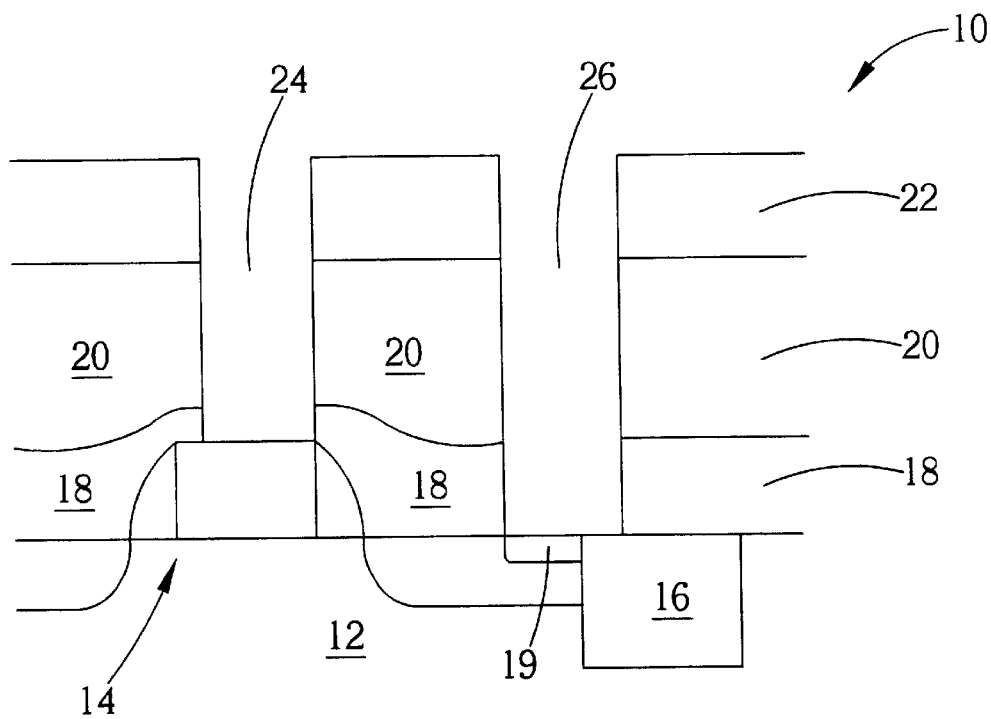
FIG. 1 is a schematic drawing of the structure of the prior art borderless contact holes 24, 26 on the semiconductor wafer 10.

Furthermore, the silicon oxide layer 36 comprises a silicon dioxide layer 35 positioned on the silicon nitride layer 34 and a phosphosilicate glass (PSG) layer 37 positioned on the silicon dioxide layer 35. The silicon dioxide layer 35 is formed by using high-density plasma enhanced chemical vapor deposition (HDP CVD). The photo-resist layer 38 comprises an opening that defines the position of the contact hole 44. The semiconductor wafer 30 comprises a unit in the substrate 32 under the hole 40 that is connected by the contact plug (not shown) as in the MOS transistor 14 in FIG. 1.

As shown in FIG. 3, in the formation of the contact hole 44, the first step is a first anisotropic process that is performed in a chamber of the etching apparatus. $C_4F_8$ and Ar are injected into the chamber as the reactive gases. Besides, CO is further added to balance the ratio of carbon atoms to fluorine atoms. Then, portions of the silicon oxide layer 36 not covered by the photo-resistor layer 38 are removed. The first anisotropic etching process performed along the hole 40 removes the PSG layer 37 and the silicon dioxide layer 35 down to the silicon nitride layer 34 to form a recess 42 for grossly forming the contact hole 44. Next, an in-situ plasma cleaning process is performed to remove all of the polymeric material remaining at the bottom of the recess and the photo-resist layer 38.

As shown in FIG. 4, an in-situ second anisotropic etching process is performed in a downward direction to remove the silicon nitride layer 34 from the bottom of the recess 42 down to the surface of the Ti-silicide layer 39 in the substrate 32 to completely form the contact hole 44. Lastly, a cleaning process is performed to remove all of the polymeric material remaining at the bottom of the contact hole 44. This cleaning process is an in-situ plasma cleaning process and a wet cleaning process. The first anisotropic etching process, the in-situ plasma cleaning process and the in-situ second isotropic etching process are all completed in one etching apparatus.

In the formation of the recess 42 by the first anisotropic etching process, the plasma bombards the reactive gaseous atoms in the chamber to generate partially ionized gas. Then, the plasma carried with a great quantity reactive ion bombards the semiconductor wafer 20 to remove the silicon oxide layer 36 under the hole 40 in a downward direction down to the surface of the silicon nitride layer 34. The reactive fluorocarbon gases generates polymers on the bottom and the side walls of the recess 42 during etching of the silicon oxide layer 36. These polymers form an assumed passivation layer. This assumed passivation layer interferes with subsequent dry etching of the silicon nitride layer 34.

So, after the first anisotropic etching process in the present invention, the in-situ plasma cleaning process is performed in the chamber to remove all of the polymeric material remaining at the bottom and on the side walls of the recess as well as removing the photo-resist layer 38. Therefore, the recess 42 in the silicon oxide layer 36 has a better profile for an improved subsequent dry etching process of the silicon nitride layer 34. When the metal material is filled into the contact hole 44 to form the borderless contact plug, no polymer remains on the surface of the contact hole 44. Therefore, the borderless contact plug thus formed has a lower contact resistance.

In contrast to the prior art method, the method of forming a contact hole on the semiconductor wafer of the present invention includes a cleaning process performed in the same apparatus after each anisotropic etching process that cleans out the polymers generated by the dry etching process. The result is a borderless contact hole with a perfect profile and no remaining polymer and a borderless contact plug with lower contact resistance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a contact hole on a semiconductor wafer, the semiconductor wafer comprising a substrate, a silicon nitride (SiN) layer positioned on the substrate, a silicon oxide layer positioned on the silicon nitride layer, and a photo-resist layer positioned on the silicon oxide layer, the photo-resist layer comprising a hole, the method comprising:

performing a first anisotropic etching process in a downward direction to remove the silicon oxide layer under the hole down to the surface of the silicon nitride layer to form a recess, wherein polymer material remains at the bottom of the recess following this first anisotropic etching process;

performing an in-situ plasma cleaning process to entirely remove the polymer material remaining at the bottom of the recess; and performing an in-situ second anisotropic etching process in a downward direction to remove the silicon nitride layer from the bottom of the recess down to the surface of the substrate to form the contact hole.

2. The method of claim 1 wherein the photo-resist layer is also removed during the in-situ plasma cleaning process.

3. The method of claim 1 wherein both the first anisotropic etching process and the in-situ plasma cleaning process are completed in one apparatus.

4. The method of claim 3 wherein the in-situ second anisotropic etching process is also completed in the apparatus.

5. The method of claim 1 wherein the contact hole is used for forming a borderless contact plug.

6. The method of claim 1 wherein the silicon oxide layer comprises a silicon dioxide layer positioned on the silicon nitride layer and a phosphosilicate glass (PSG) layer positioned on the silicon dioxide layer, and the silicon dioxide layer is formed by using high-density plasma enhanced chemical vapor deposition (HDP CVD) method.

7. The method of claim 1 wherein polymer material remains at the bottom of the contact hole after completion of the in-situ second anisotropic etching, and the method further comprises the following step:

performing a cleaning process to entirely remove the polymer material remaining at the bottom of the contact hole.

8. The method of claim 7 wherein the cleaning process is an in-situ plasma cleaning process or a wet cleaning process.

* * * * *